United States Patent [19]

Echigoya et al.

[11] Patent Number: 5,341,018
[45] Date of Patent: Aug. 23, 1994

[54] SEMICONDUCTOR INTEGRATED CIRCUIT DEVICE HAVING A PLURALITY OF INPUT CIRCUITS EACH INCLUDING DIFFERENTLY SIZED TRANSISTORS

[75] Inventors: Kenichi Echigoya; Hidehiro Asai, both of Kanagawa, Japan

[73] Assignee: NEC Corporation, Tokyo, Japan

[21] Appl. No.: 945,882

[22] Filed: Sep. 17, 1992

[30] Foreign Application Priority Data

Sep. 18, 1991 [JP] Japan .................................. 3-237537

[51] Int. Cl.⁵ .......................................... H01L 27/02
[52] U.S. Cl. ..................................... 257/503; 257/500; 257/692; 361/767; 361/780
[58] Field of Search ............... 257/203, 207, 599, 501, 257/503, 546, 690, 692; 361/767, 777, 780

[56] References Cited

U.S. PATENT DOCUMENTS

| | | | |
|---|---|---|---|
| 4,475,119 | 10/1984 | Kuo et al. | 257/207 |
| 4,893,168 | 1/1990 | Takahashi et al. | 257/203 |
| 4,904,887 | 2/1990 | Sugiyama et al. | 257/203 |
| 4,947,233 | 8/1990 | Aso | 257/203 |
| 4,952,997 | 8/1990 | Sugiyama et al. | 257/207 |
| 4,992,845 | 2/1991 | Arakawa et al. | 257/203 |
| 5,039,884 | 8/1991 | Hara | 257/203 |
| 5,063,429 | 11/1991 | Crafts | 257/207 |
| 5,121,036 | 6/1992 | Fuji | 257/207 |

Primary Examiner—Rolf Hille
Assistant Examiner—David Ostrowski
Attorney, Agent, or Firm—Burns, Doane, Swecker & Mathis

[57] ABSTRACT

Disclosed hereby is a technique to compensate for variations of the logical thresholds of the plurality of input initial stage circuits of a semiconductor integrated circuit due to the parasitic resistances of wiring layers (the power supply wiring layer and the ground wiring layer) for the supply of a fixed potential.

The dimensions of the transistors constituting the input initial stage circuits, for instance the channel widths of the N-channel MOSFET's of CMOS inverters, are enlarged to compensate for an increase in the logical thresholds due to the parasitic resistances of the ground wiring layer. The unevenness of logical thresholds of the plurality of input initial stage circuits due to their respective positions in the semiconductor chip can be thereby reduced.

9 Claims, 5 Drawing Sheets

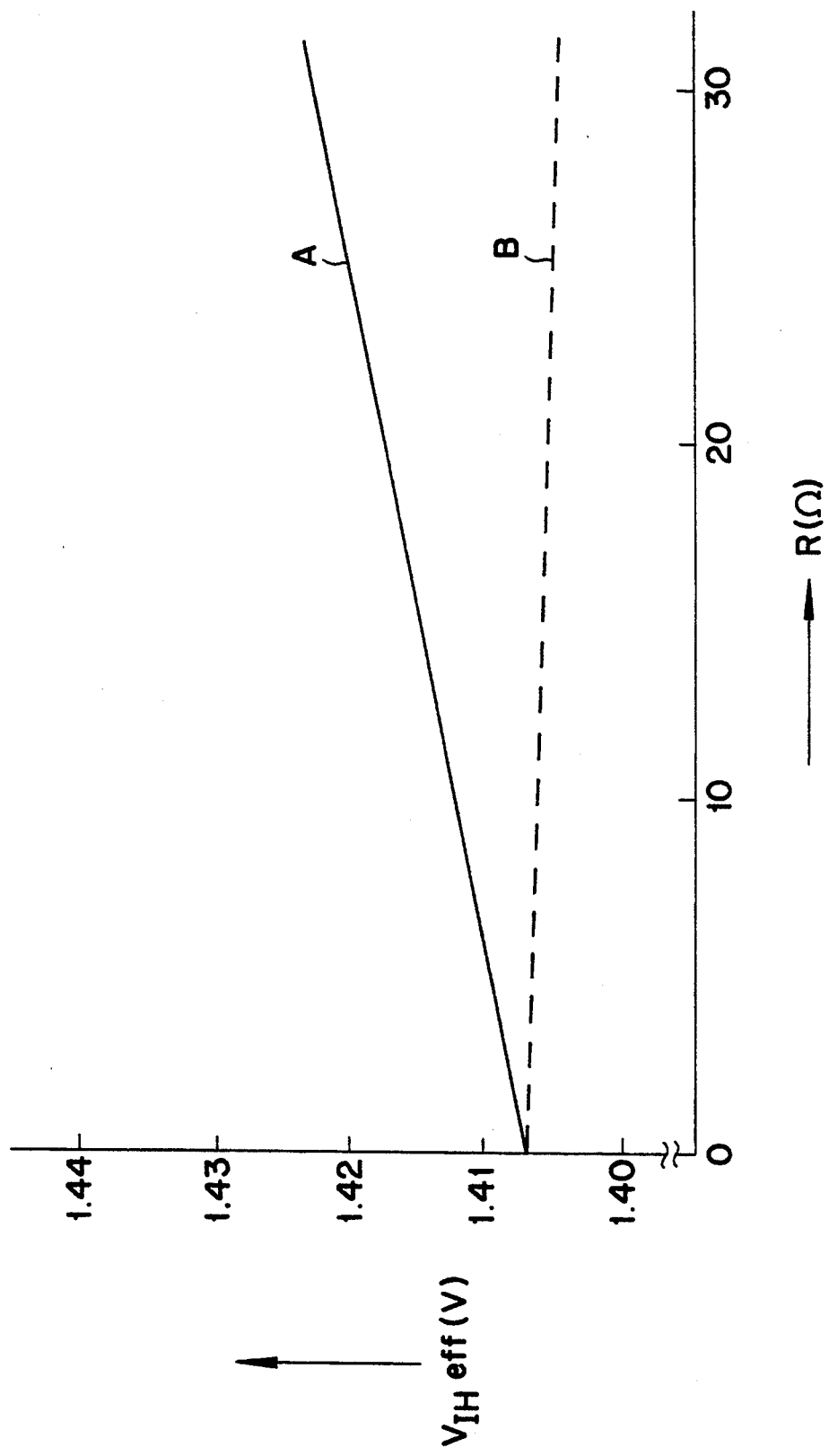

SEMICONDUCTOR INTEGRATED CIRCUIT DEVICE HAVING A PLURALITY OF INPUT CIRCUITS EACH INCLUDING DIFFERENTLY SIZED TRANSISTORS

BACKGROUND OF THE INVENTION

The present invention relates to a semiconductor integrated circuit (IC), and more particularly to an IC having improved input initial-stage circuits.

An IC has at least one each of power supply terminal and grounding terminal. The power supply terminal and the grounding terminal are connected to the bonding pads of the semiconductor chip, i.e. the power supply pad and the grounding pad, respectively. The power supply pad and the grounding pad are connected to the power supply wiring layer and the ground wiring layer, respectively. Electronic circuits in the semiconductor chip are connected to the power supply wiring layer and the ground wiring layer. The power supply wiring layer and the ground wiring layer are usually formed of films of aluminum alloy, such as Al—Si—Cu, and have sheet resistances of 30 to 40 m$\Omega$/□. Accordingly, there is a resistance between the power supply pad or the grounding pad and any electronic circuit.

An input initial-stage circuit has the role to convert an input signal, supplied from outside, into an internal signal. In a CMOS integrated circuit, it converts a digital signal of the TTL level, for instance, into one of the CMOS level.

In a conventional IC according to the prior art, a plurality of input initial stage circuits are designed in the same shape and dimensions irrespective the position in which each is arranged on the IC chip. Even if all these input initial stage circuits have the same logical threshold, the distances from the power supply pad and from the grounding pad differ from one input initial stage circuit to another, and individual input initial stage circuits differ from one another in parasitic resistance, so that the effective logical threshold as viewed from an external terminal differs from one input initial stage circuit to another. Where many input initial stage circuits are connected to a single wiring layer and become operative at the same time, the variations of their effective logical thresholds increase.

Among the typical examples of such input initial stage circuits are the address inverters of a semiconductor memory. All these address inverters, which are circuits to receive address signals of the TTL level given from outside and convert them into signals of the CMOS level, become operative in a write-in or read-out operation. While the number of address terminals increases as the semiconductor memory becomes more highly integrated, the thickness of the aluminum alloy films decreases, resulting in greater parasitic resistances. Accordingly, there is a great difficulty to keep the effective logical thresholds of the address inverters of a semiconductor memory within a prescribed standard range.

SUMMARY OF THE INVENTION

Therefore, an object of the present invention is to provide an IC having a plurality of input initial stage circuits which are more uniform in effective logical threshold.

Another object of the invention is to provide a semiconductor memory having a plurality of address buffers of CMOS configuration, which are more uniform in effective logical threshold.

An IC according to the invention has bonding pads for supplying the semiconductor chip with such fixed potentials as the power supply potential and the ground potential. To these bonding pads is connected a wiring layer for selectively coating specified inter-layer insulating films. The logical thresholds of these input initial stage circuits are set at values corresponding to their respective distances from the bonding pads to compensate for variations in effective logical threshold with the resistance of the wiring layer.

Where input initial stage buffers are address buffers of CMOS configuration in a semiconductor memory, the dimensions, preferably the channel widths, of MOS transistors are set at values corresponding to the respective distances from the grounding pad. For instance, the dimensions of P-channel MOSFET's are designed to be the same for all the input initial stage circuits, and the increase in effective logical threshold due to the resistance of the ground wiring layer is compensated for by providing large channel widths for N-channel MOSFET's.

BRIEF DESCRIPTION OF THE DRAWINGS

The above-mentioned and other objects, features and advantages of the present invention will become more apparent from the following detailed description when taken in conjunction with the accompanying drawings, wherein:

FIG. 5 is a graph showing the relationship between the effective logical threshold $V_{IHeff}$ of the CMOS inverter and the resistance R, wherein straight lines A and B correspond to the circuits of FIGS. 4(a) and 4(b), respectively.

DETAILED DESCRIPTION OF THE PREFERRED EMBODIMENT

Figure 1:
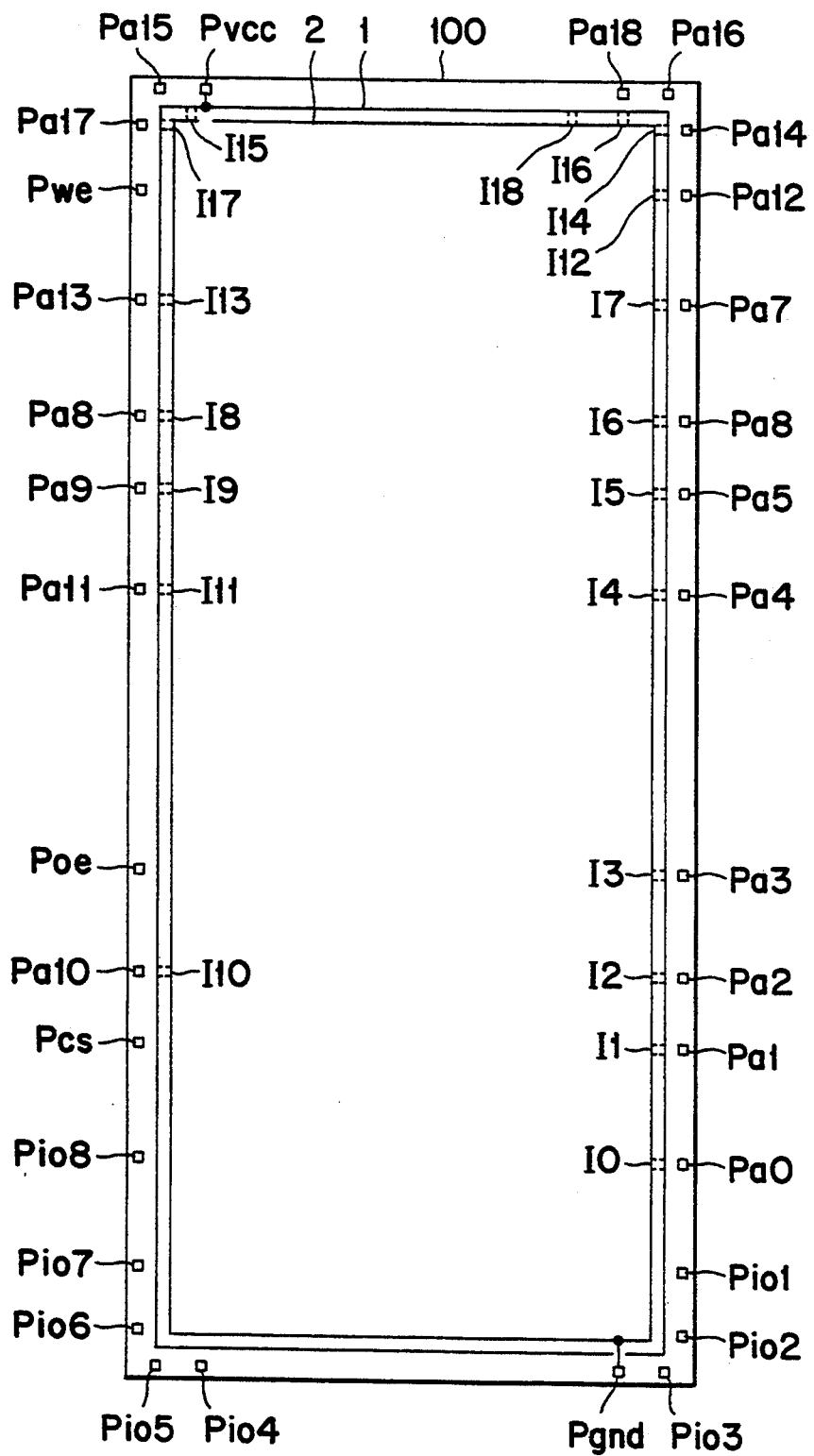
FIG. 1 is a rough plan of a semiconductor chip, which is one preferred embodiment of the invention.

Referring to FIG. 1, a 4M SRAM of 512k word by 8 bit configuration, which is a preferred embodiment of the present invention, has a rectangular semiconductor chip 100 measuring 8 mm by 18 mm. Near one corner (upper left in the drawing) of the semiconductor chip 100 is provided a power supply Pvcc, which is connected to a power supply wiring layer 1. The power supply wiring layer 1 is provided almost fully around the circumference of the semiconductor chip 100. A grounding pad Pgnd is arranged symmetrically to the power supply pad Pvcc with respect to the center point of the semiconductor chip 100, and connected to a ground wiring layer 2. The ground wiring layer 2 is arranged in parallel to the power supply wiring layer 1 and almost fully around the circumference of the semiconductor chip 100. Incidentally, although each of the grounding pad Pgnd and the power supply pad Pvcc is illustrated as a single pad, they actually are a dual pad.

Counterclockwise along the periphery of the semiconductor chip 100 are arranged, so as to go away from the grounding pad Pgnd, input/output pads Pio3, Pio2 and Pio1, and address pads Pa0, Pa1, Pa2, Pa3, Pa4, Pa5, Pa8, Pa7, Pa12, Pa14, Pa16 and Pa18 in that order. Similarly are provided clockwise input/output pads Pio4, Pio5, Pio6, Pio7 and Pio8, a chip select pad Pcs, an address pad Pa10, an output enable pad Poe, address pads Pa11, Pa9, Pa8 and Pa13, a write enable pad Pwe, and address pads Pa 17 and Pa15.

Near the address pads Pa0, Pa1, . . . , Pa18 in the region sandwiched between the power supply wiring layer 1 and the ground wiring layer 2 are provided address inverters I0, I1, . . . , I18, respectively.

Figure 2:
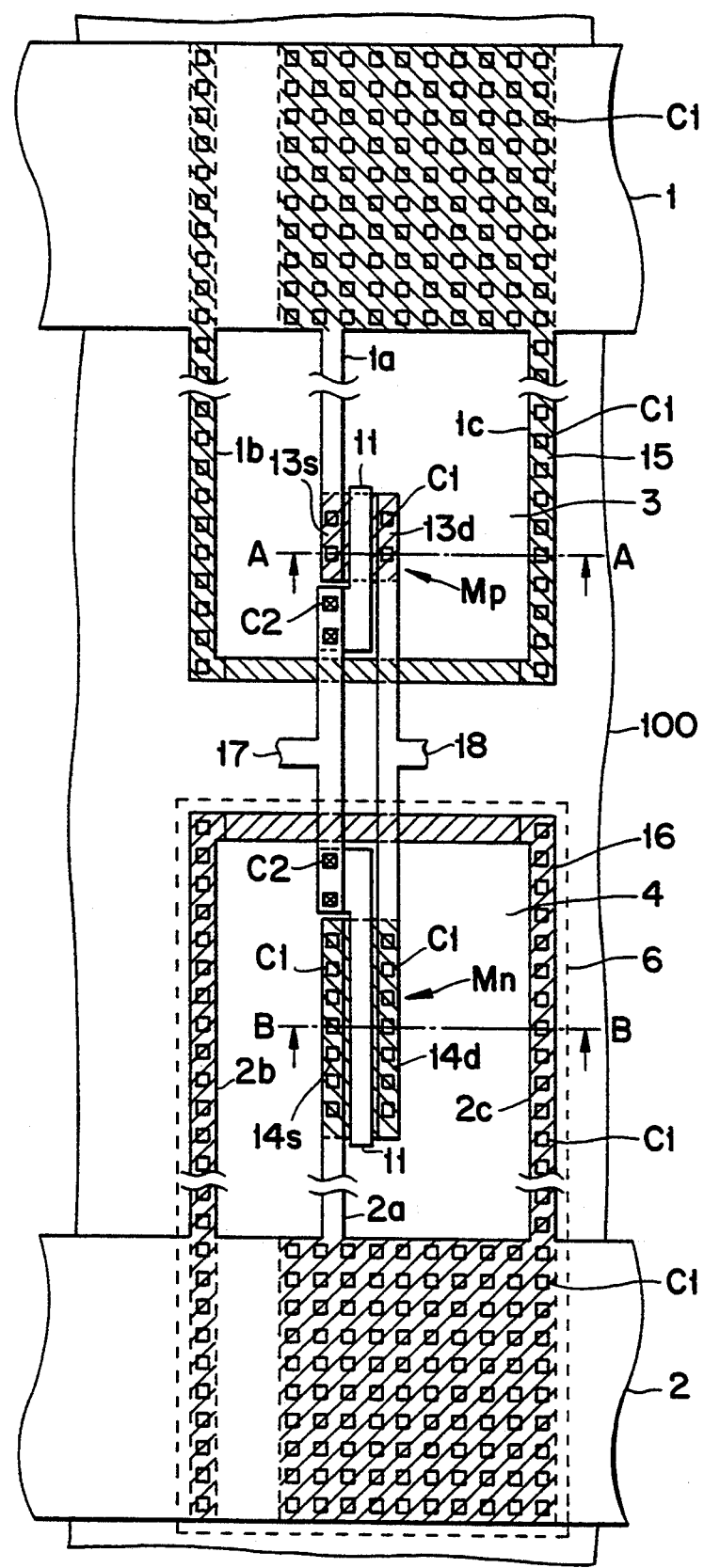
FIG. 2 is a plan of an address inverter in said embodiment of the invention.
Figure 3A:
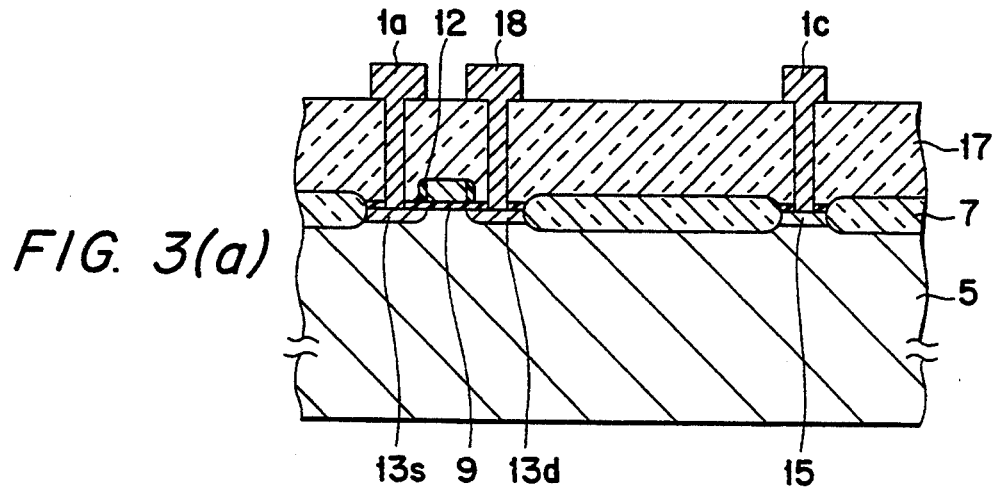
FIG. 3(a) shows a P-channel MOSFET in an A—A cross section of FIG. 2.
Figure 3B:
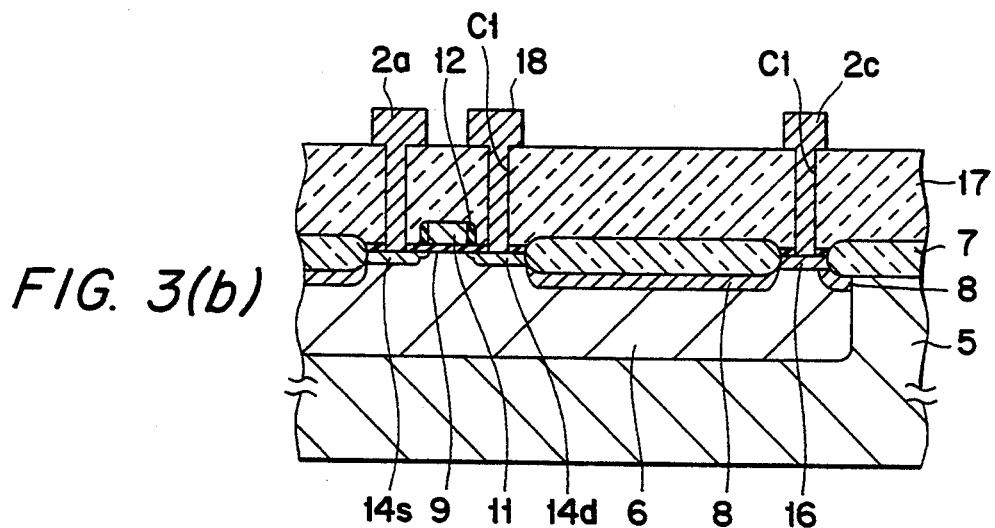
FIG. 3(b) shows an N-channel MOSFET in a B—B cross section of FIG. 2.

Now will be described the address inverters I0, I1, . . . , I18 with reference to FIGS. 2 and 3. These address inverters are CMOS inverters having basically the same structure.

In an element formation region 3, which is on the power supply wiring layer 1 side of the region sandwiched between the power supply wiring layer 1 and the ground wiring layer 2 of the semiconductor chip, there are formed P-channel MOSFET's Mp, which constitute address inverters, and P-channel MOSFET's for decoders not shown. In another element formation region 4 on the ground wiring layer 2 side are formed N-channel MOSFET's Mn, which constitute address inverters, and N-channel MOSFET's for decoders not shown.

The circumference of the element formation region 3 is surrounded by an N+-type diffusion layer 15 for substrate contact, and that of the element formation region 4 is surrounded for a P+-type diffusion layer 16 for well contact, formed around the periphery of a P-well 6, which is selectively formed on the surface part of an N-type silicon substrate 5.

In the element formation regions 3 and 4 is selectively formed a gate oxide film 9 over the surfaces of the N-type silicon substrate 5 and of the P-well 6, respectively. Selectively coating the gate oxide film 9, there is formed a gate electrode 11 consisting of a polycrystalline silicon film of about 300 nm in thickness. Beside the gate electrode 11 are spacers 12 consisting of silicon oxide films. Reference signs 13s and 13d denote the source and drain regions, respectively, of the P-channel MOSFET's, and 14s and 14d, the source and drain regions, respectively, of the LDD-type N-channel MOSFET's. An interlayer insulating film 10, covering the gate electrode 11 and a field oxide 7, whose bottom is in contact with a channel stopper 8 in the P-well 6 section) is a four-layer insulating film, because the memory cells of the 4M SRAM, which is this embodiment, are CMOS flip-flops of TFT load, formed by a four-layer polycrystalline silicon process. The power supply wiring layer 1, its three branches 1a, 1b and 1c, the ground wiring layer 2 and its three branches 2a, 2b and 2c, an address input wiring layer 17 and an address inverter output wiring layer 18 are all composed of Al—Si—Cu alloy films of about 1 micron in thickness.

The branch 1a of the power supply wiring layer 1 is connected to a source region 13s via a contact hole C1. The branches 1b and 1c are similarly connected to the N+-type diffusion layer 15. The branch 2a of the ground wiring layer 2 is connected to a source region 14s via the contact hole C1, and the branches 2b and 2c are connected to the P+-type diffusion layer 16. The address input wiring layer 17 is connected to two gate electrodes 11 via a through hole C2 (denoted by a square sign with diagonals) bored from the surface of the interlayer insulating film 10 to the surface of the gate electrodes 11. An address inverter output layer 18 is connected via the contact hole C1 to the drain region 13d of Mp and to the drain region 14d of Mn. One of the reasons for the many contact holes provided underneath the power supply wiring layer 1 and the ground wiring layer 2 is to firmly fix these wiring layers and thereby to prevent their sliding or disconnection.

The threshold voltage, channel length and channel width of the P-channel MOSFET's Mp are −0.7 V, 1.2 microns and 4 microns, respectively, designed to be the same for all the address inverters. The threshold voltage and channel length of the N-channel MOSFET's Mn are 0.7 V and 1.1 microns, respectively, designed to be the same for all the address inverters. The channel width of the N-channel MOSFET's Mn are designed to be 15 microns for the address inverters I0, I1, I2, I3, I4, I5, I, I7, I10, I12, I14, I16 and I18, 16 microns for I11, I9 and I8, and 17 microns for I13, I17 and I15.

The breadth of the power supply wiring layer 1 and of the ground wiring layer 2 is 40 microns, and their sheet resistances are about 41 mΩ/□. A ground wiring layer resistance of about 3.6 Ω is parasitic to the address inverter I0, which is the closest to the grounding pad Pgnd, and one of about 24.7 Ω, to the address inverter I15, which is the farthest from the grounding pad Pgnd.

Next will be explained the relationship between the effective logical thresholds of the CMOS inverters and the parasitic resistances of wiring.

Figure 4A:
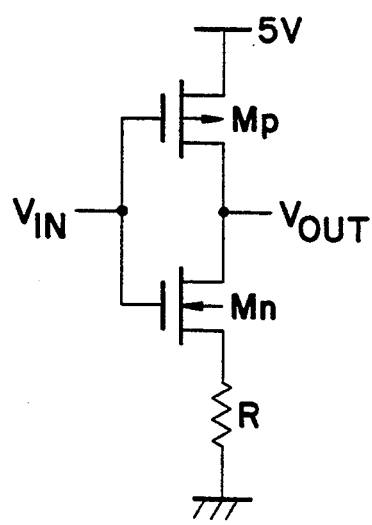
FIG. 4(a) is a circuit diagram showing the insertion of a resistance R on the grounding side of a CMOS inverter.
Figure 4B:
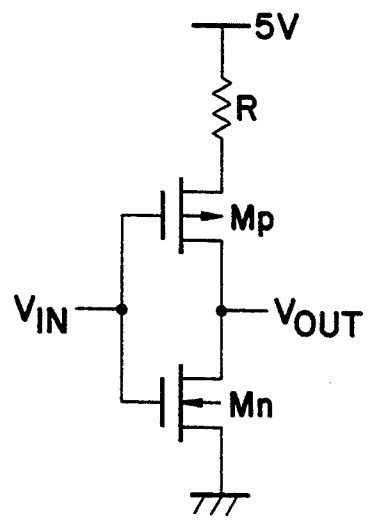
FIG. 4(b) is a circuit diagram showing the insertion of the resistance R on the power supply side of the CMOS inverter.

As illustrated in FIGS. 4(a) and 4(b), it can be theoretically calculated that the effective logical threshold $V_{IHeff}$, when resistances R are inserted between the CMOS inverters and the grounding terminal and between the CMOS inverters and the power supply terminal, are approximately such as indicated by the straight lines A and B in FIG. 5, provided that the source voltage is 5 volts and the CMOS inverters are the same as the aforementioned address inverters I0, I1 and so forth. The threshold $V_{IHeff}$ is reduced by the resistance on the power supply side, which has been increased by the resistance on the grounding side, but the influence of the resistance on the power supply side is insignificant.

Where the power supply pad Pvcc and the grounding pad Pgnd are arranged in positions of approximate point symmetry to each other as in this embodiment, the sum of the grounding side parasitic resistances and the power supply side parasitic resistances of all the address inverters is considered substantially constant. Whereas $V_{IHeff}$ is largely determined by the grounding side parasitic resistance, there is some cancelling effect of the power supply side parasitic resistance.

Figure 6:
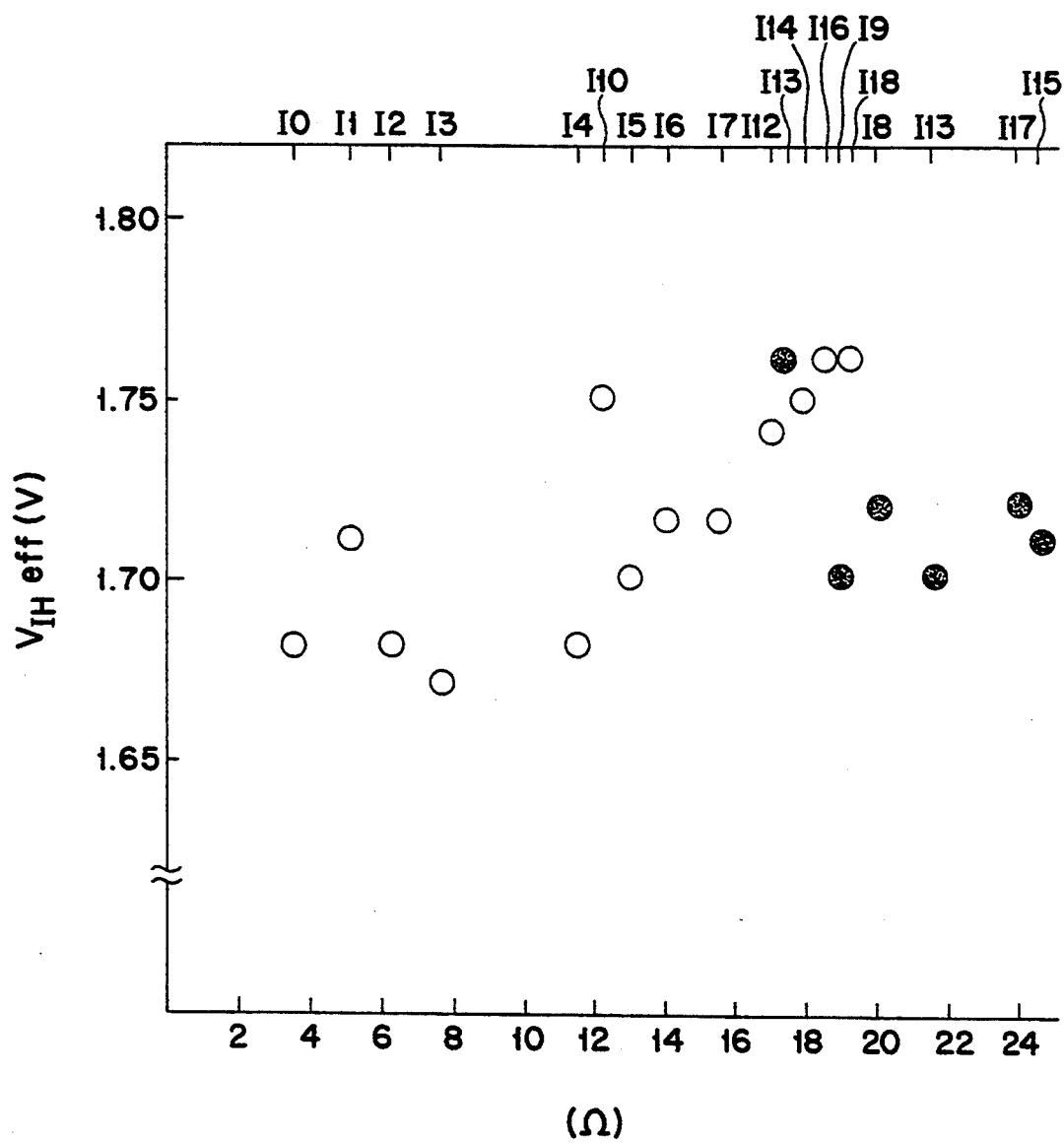
FIG. 6 is graph showing the effective thresholds $V_{IHeff}$ of the address inverters I0, I1, . . . , I18 in said embodiment as they relate to the resistance of the ground wiring layer.

FIG. 6 shows the actual measurements of the $V_{IHeff}$ of the address inverters I0, I1, . . . , I18 of this embodiment. It has to be noted that the same gradually varying signals were fed to all the address inverters in the read-out mode. Since, therefore, currents flow from many circuits to the ground wiring layer 2, the values are likely to vary more greatly than are indicated in FIG. 5. In FIG. 6, the $V_{IHeff}$ measurements of address inverters whose N-channel MOSFET channel width is 15 microns are represented by white dots, and all others, by black dots. It is considered that, by increasing the channel width, a comparable $V_{IHeff}$ level to that of the others was achieved to thereby reduce the unevenness of $V_{IHeff}$ values due to the wiring layer resistance.

Although compensation is made in this embodiment to uniformize the effective thresholds by increasing the channel widths of the N-channel MOSFET's, the same effect can be achieved by decreasing those of the P-channel MOSFET's.

Whereas the initial stage of address buffers in the above described embodiment consists of CMOS inverters, there also is an SRAM in which chip select signals CS, after having passed a buffer circuit, are subjected to NOT-OR operation with address input signals Ai (i=0, 1, 2, ..., 18), and in this case the NOT-OR gates can be composed of two-input CMOS NOR circuits and compensation made to the P-channel MOSFET's or the N-channel MOSFET's, to which the address input signals Ai are to be supplied, by adjusting the channel width.

The present invention is applicable not only to the input initial stage circuits of CMOS configuration, but also to input initial stage circuits including E—E inverters or E—D inverters. Moreover, it must be apparent to persons skilled in the art that it is applicable not only to SRAM's but also semiconductor memories in general including DRAM's and further to IC's each having a plurality of input initial stage circuits.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A semiconductor integrated circuit device comprising:
   a semiconductor chip,
   a first bonding pad formed on said semiconductor chip and supplied with a first power voltage,
   a second bonding pad formed on said semiconductor chip and supplied with a second power voltage,
   a first wiring connected to said first bonding pad and elongated along a periphery of said semiconductor chip,
   a second wiring connected to said second bonding pad and elongated along the periphery of said semiconductor chip,
   a third bonding pad formed on said semiconductor chip at a first distance from said first bonding pad and supplied with a first input signal,
   a fourth bonding pad formed on said semiconductor chip at a second distance from said first bonding pad and supplied with a second input signal,
   said first distance being larger than said second distance,
   a first input circuit formed on said semiconductor chip adjacent to said third bonding pad and coupled between said first and second wirings and further to said third bonding pad to receive said first input signal,
   said first input circuit including a first transistor having a gate connected to said third bonding pad and a first ratio of a channel width to a channel length, and
   a second input circuit formed on said semiconductor chip adjacent to said fourth bonding pad and coupled between said first and second wirings and further to said fourth bonding pad to receive said second input signal, said second input circuit including a second transistor having a gate connected to said fourth bonding pad and a second ratio of a channel width to a channel length, wherein said first ratio is larger than said second ratio such that said first input circuit has a logical threshold level that is substantially equal to a logical threshold level of said second input circuit.

2. The device as claimed in claim 1, wherein said first bonding pad is supplied with a ground voltage and each of said first and second transistors are of a P-channel type having a source electrode connected to said first wiring to receive said ground voltage.

3. A semiconductor integrated circuit device comprising:
   a semiconductor chip,
   a first bonding pad formed on said semiconductor chip and supplied with a first power voltage,
   a second bonding pad formed on said semiconductor chip and supplied with a second power voltage,
   a first wiring lead out from said first bonding pad and extended along a periphery of said semiconductor chip,
   a second wiring lead out from aid second bonding pad and extended along the periphery of said semiconductor chip,
   a third bonding pad formed on said semiconductor chip at a first distance from said first bonding pad and supplied with a first input signal,
   a fourth bonding pad formed on said semiconductor chip at a second distance from said first bonding pad and supplied with a second input signal, said first distance being larger than said second distance,
   a first inverter formed on said semiconductor chip adjacent to said third bonding pad and having a first transistor of one channel type and a second transistor of an opposite channel type connected in series between said first and second wirings, said first and second transistors having gates connected in common to said third bonding, and
   a second inverter formed on said semiconductor chip adjacent to said fourth bonding pad and having a third transistor of said one channel type and a fourth transistor of said opposite channel type connected in series between said first and second wirings, said third and fourth transistors having gates connected in common to said fourth bonding pad, said second transistor having a channel width larger than a channel width of said fourth transistor such that said first inverter has a logical threshold level that is substantially equal to a logical threshold level of said second inverter.

4. The device as claimed in claim 3, wherein said second transistor has a channel length that is substantially equal to a channel length of said fourth transistor and said first transistor has a channel width and a channel length which are substantially equal respectively to a channel width and a channel length of said third transistor.

5. The device as claimed in claim 4, wherein said one channel type is a P-channel type and said opposite channel type is an N-channel type.

6. A semiconductor integrated circuit device comprising:
- a semiconductor chip,
- a first power bonding pad formed on said semiconductor chip and supplied with a ground voltage,
- a second power bonding pad formed on said semiconductor chip and supplied with a power voltage,
- a first wiring lead extending from said first power bonding pad and along a periphery of said semiconductor chip,
- a second wiring lead extending from said second power bonding pad and along the periphery of said semiconductor chip,
- a first group of input bonding pads arranged along the periphery of said semiconductor chip and each supplied with an input signal,
- a second group of second input bonding pads arranged along the periphery of said semiconductor chip and each supplied with an input signal, said second group of input bonding pads intervening between said first power bonding pad and said first group of input bonding pads,
- a first group of inverters each formed on said semiconductor chip adjacent to an associate one of said first group of input bonding pads and including a first transistor of a P-channel type and a second transistor of an N-channel type connected in series between said first and second wirings and having gates connected in common to said associated one of said first group of input bonding pads, and
- a second group of inverters each formed on said semiconductor chip adjacent to an associated one of said second group of input bonding pads and including a third transistor of said P-channel type and a fourth transistor of said N-channel type connected in series between said first and second wirings and having gates connected in common to said associated one of said second group of input bonding pads, each of said second transistors in said first group of inverters having a first ratio of a channel width to a channel length, each of said fourth transistors in said second group of inverters having a second ratio of a channel width to a channel length, wherein said first ratio is greater than said second ratio.

7. The device as claimed in claim 6, wherein the channel length of each of said second transistors in said first group of inverters is substantially equal to the channel length of each of said fourth transistors in said second group of inverters and the channel width of each of said second transistors in said first group of inverters is larger than the channel width of each of said fourth transistors in said second group of inverters.

8. The device as claimed in claim 7, wherein each of said first transistors has a third ratio of a channel width to a channel length and each of said third transistors has a fourth ratio of a channel width to a channel length, said third ratio being substantially equal to said fourth ratio.

9. The device as claimed in claim 8, wherein the channel width of each of said first transistors is substantially equal to the channel width of each of said third transistors and the channel length of each of said first transistors is equal to the channel length of said third transistors.

* * * * *